US009880330B1

(12) United States Patent
Koshelev et al.

(10) Patent No.: US 9,880,330 B1
(45) Date of Patent: Jan. 30, 2018

(54) ANGLE-INSENSITIVE SPECTRAL FILTER

(71) Applicant: aBeam Technology, Inc., Hayward, CA (US)

(72) Inventors: Alexander Koshelev, Berkeley, CA (US); Keiko Munechika, Oakland, CA (US)

(73) Assignee: ABeam Technologies, Inc., Hayward, CA (US)

( * ) Notice: Subject to any disclaimer, the term of this patent is extended or adjusted under 35 U.S.C. 154(b) by 30 days.

(21) Appl. No.: 15/257,044

(22) Filed: Sep. 6, 2016

(51) Int. Cl.
G02B 5/20 (2006.01)
G02B 5/26 (2006.01)
H04N 5/225 (2006.01)
G02B 3/00 (2006.01)
H04N 9/04 (2006.01)

(52) U.S. Cl.
CPC ........... *G02B 5/201* (2013.01); *G02B 3/0056* (2013.01); *G02B 5/26* (2013.01); *H04N 9/045* (2013.01)

(58) Field of Classification Search
None
See application file for complete search history.

(56) References Cited

U.S. PATENT DOCUMENTS

| | | | | |
|---|---|---|---|---|
| 7,667,796 B2 * | 2/2010 | Hasei | ..................... | G02B 5/201 349/106 |
| 9,507,264 B2 * | 11/2016 | Tsai | ..................... | G03F 7/2022 |
| 2010/0007975 A1 * | 1/2010 | Tsao | ..................... | G02B 5/201 359/891 |
| 2012/0223979 A1 * | 9/2012 | Matsukura | ............. | G02B 5/201 345/690 |
| 2014/0084137 A1 * | 3/2014 | de Groot | ........... | H01L 27/14625 250/208.1 |
| 2016/0013355 A1 * | 1/2016 | Minixhofer | ....... | H01L 27/14621 438/70 |
| 2016/0047690 A1 * | 2/2016 | Yun | ....................... | G01J 1/0492 250/206 |
| 2017/0272709 A1 * | 9/2017 | Hagiwara | ............. | H04N 9/083 |

* cited by examiner

Primary Examiner — W B Perkey

(57) ABSTRACT

In one embodiment, an optical element includes a first semi-transparent semi-reflective layer and a second semi-transparent semi-reflective layer. The optical element includes a first transparent material having a first refractive index and disposed between the first semi-transparent semi-reflective layer and the second semi-transparent semi-reflective layer. The optical element includes a second transparent material having a second refractive index, disposed between the first semi-transparent semi-reflective layer and the second semi-transparent semi-reflective layer, and surrounding the first transparent material in a plane parallel to the first semi-transparent semi-reflective layer and the second semi-transparent semi-reflective layer. The first refractive index is higher than the second refractive index.

20 Claims, 11 Drawing Sheets

ANGLE-INSENSITIVE SPECTRAL FILTER

BACKGROUND

Field

The present disclosure relates generally to optical elements and, in particular, to optical elements that function as an angle-insensitive spectral filter.

Description of the Related Art

Hyperspectral imaging technology is widely used in agriculture, environmental monitoring, remote sensing, and military. As technological advances occur, hyperspectral imaging technology can also be employed in the consumer market. Integration of a hyperspectral sensor into handheld devices, such as mobile phones, can provide opportunities for everyday applications.

One limitation of hyperspectral imaging technology is the angular sensitivity of the types of hyperspectral sensors found in typical imaging devices, including diffraction gratings, multilayer filters, guided mode resonance sensors, Fabry-Perot resonators, Fourier transform spectrometers, etc. In particular, the spectral response of typical hyperspectral sensors is different for different angles of incidence. To overcome this, many hyperspectral devices collimate the input light by using additional optical components, angular filters, narrow entrance slits, and/or low numerical aperture optics. The drawbacks associated with these approaches are loss of light, increased bulkiness and cost, and limited spatial and spectral resolution.

DETAILED DESCRIPTION

As noted above, many types of spectral filters suffer from angle sensitivity in that the spectral response of the filter is different for different angles of incidence. An angle-insensitive spectral filter eliminates the need for collimated light and enables opportunities to develop compact, chip-based, high-resolution hyperspectral imagers and spectrometers. Such on-chip devices could be used in variety of applications, including defense, consumer products, medicine, and many areas of science and technology. Accordingly, described herein are various embodiments of angle-insensitive spectral filters and methods of manufacturing such angle-insensitive spectral filters.

Figure 1:
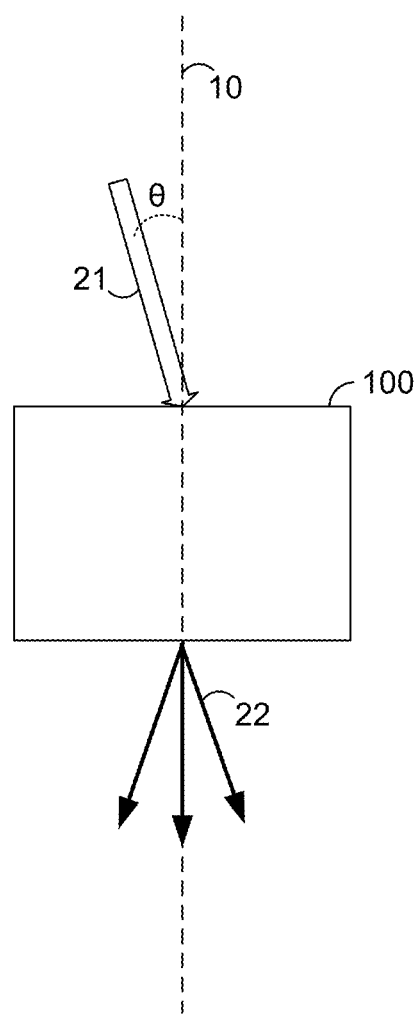
FIG. 1 illustrates a functional block diagram of an optical element functioning as an angle-insensitive spectral filter.

FIG. 1 illustrates a functional block diagram of an optical element 100 functioning as an angle-insensitive spectral filter. An incident beam of light 21 that includes many different wavelengths of light is incident upon the optical element 100 at a non-zero incident angle θ with an axis 10 through the optical element 100. The optical element 100 transmits a single wavelength of light of the incident beam of light 21, thereby forming a transmitted beam of light 22. The optical element 100 either absorbs or reflects other wavelengths of the incident beam of light 21.

Whereas the incident beam of light 21 includes multiple wavelengths of light, the transmitted beam of light 22 includes a single wavelength of light. The optical element 100 functions such that the single wavelength of light of the transmitted beam of light 22 is independent of the incident angle θ of the incident beam of light 21, at least over a wide range of incident angles, e.g., from −25° to 25°.

Because the wavelength of the transmitted beam of light 22 are independent of the incident angle θ of the incident beam of light 21, the optical element operates as an angle-insensitive spectral filter.

In some embodiments, such as when the optical element 100 includes a single resonator as described below in, for example, FIG. 2A, the light transmitted through the resonator forms a transmitted beam of light 22 that includes light (of a single wavelength) transmitted from the optical element 100 at a wide range of angles with the axis 10. For example, the wide range of angles can be centered at a zero angle with the axis 10 independent of the incident angle θ.

In some embodiments, such as when the optical element 100 includes an array of resonators as described below in, for example, FIG. 3, the light transmitted through each resonator interferes to create a transmitted beam of light 22 that includes light (of a single wavelength) transmitted from the optical element at a non-zero angle with the axis 10 dependent on the incident angle θ. For example, the transmitted angle can be equal to the incident angle θ. As another example, the transmitted angle can be a function of the incident angle θ when the optical element is configured as a lens as described further below.

Figure 2A:
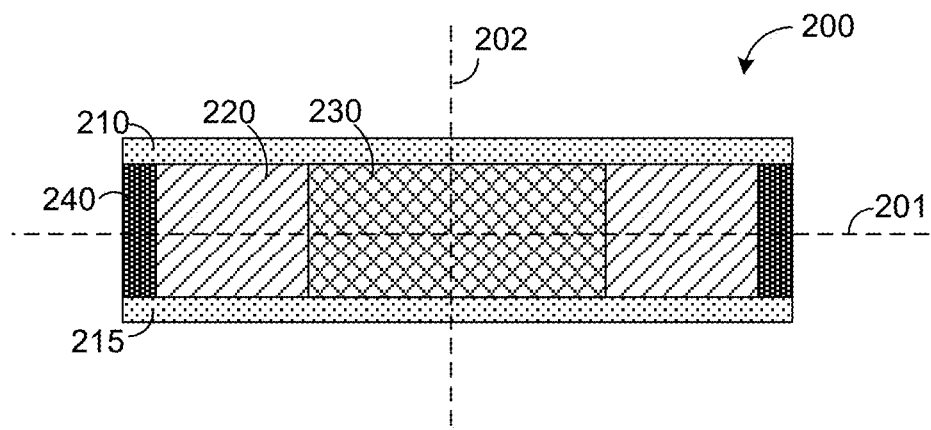
FIG. 2A illustrates a cross-sectional side view of an optical element that can function as an angle-insensitive spectral filter.
Figure 2B:
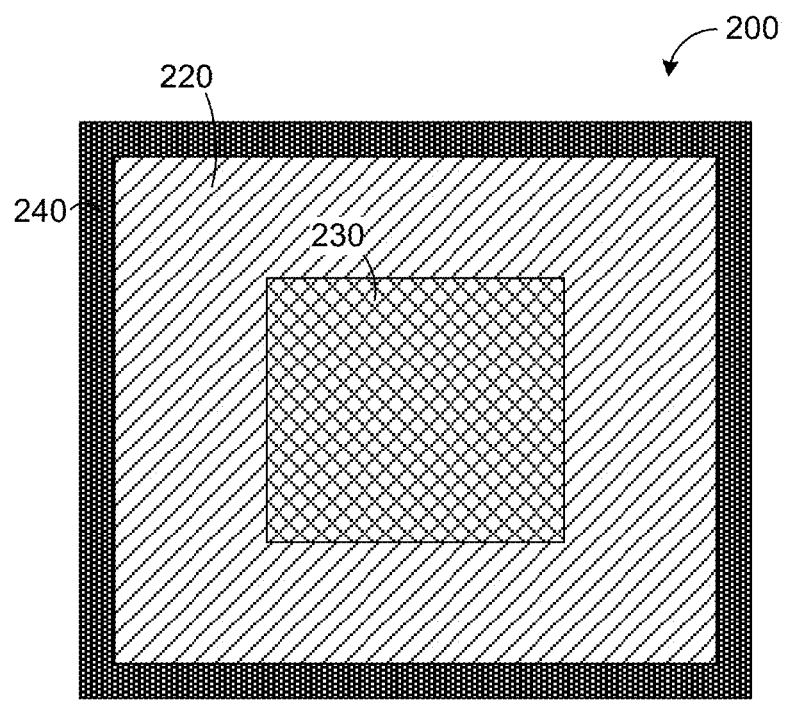
FIG. 2B illustrates a cross-sectional top view of the optical element of FIG. 2A.

FIG. 2A illustrates a cross-sectional side view of an optical element 200 that can function as an angle-insensitive spectral filter. FIG. 2B illustrates a cross-sectional top view of the optical element 200 of FIG. 2A. The optical element 200 includes a first semi-transparent semi-reflective layer 210 and a second semi-transparent semi-reflective layer 215. In some embodiments, the first semi-transparent semi-reflective layer 210 and/or the second semi-transparent semi-reflective layer 215 can include a thin layer of metal. For example, the first semi-transparent semi-reflective layer 210 and/or the second semi-transparent semi-reflective layer can be between approximately 30 nanometers (nm) and 60 nm thick. As another example, the first semi-transparent semi-reflective layer 210 and/or the second semi-transparent semi-reflective layer 215 can include silver. In some embodiments, the first semi-transparent semi-reflective layer 210 and/or the second semi-transparent semi-reflective layer 215 can include a dielectric stack. For example, the first semi-transparent semi-reflective layer 210 and/or the second semi-transparent semi-reflective layer can include multiple sub-layers of different materials having different refractive indexes (e.g., silicon nitride and silicon dioxide or titanium dioxide and silicon dioxide). Such a dielectric stack can be, for example, approximately 2 microns thick.

The optical element 200 includes a first transparent material 230 disposed between the first semi-transparent semi-reflective layer 210 and the second semi-transparent semi-reflective layer 215. The first transparent material 230 has a first refractive index. A second transparent material 220 is disposed between the first semi-transparent semi-reflective layer 210 and the second semi-transparent semi-reflective layer 215. The second transparent material 220 surrounds the first transparent material 230 in a plane 201 parallel to the first semi-transparent semi-reflective layer 210 and the second semi-transparent semi-reflective layer 215 (e.g., parallel to the page in FIG. 2B). The second transparent material 220 has a second refractive index. The first refractive index (of the first transparent material 230) is higher than the second refractive index (of the second transparent material 220). For example, in some embodiments, the first refractive index is approximately 1.7 (or greater) and the second refractive index is approximately 1.5.

In some embodiments, the first transparent material 230 includes a polymer having a refractive index of approximately 1.7 (or greater). In some embodiments, the second transparent material 220 includes silicon dioxide having a refractive index of approximately 1.5. In some embodiments, the second transparent material 220 includes a dielectric stack including multiple layers of different materials having different refractive indexes, the average refractive index of the multiple layers being less than the refractive index of the first transparent material 230.

The optical element 200 includes an absorptive material 240 disposed between the first semi-transparent semi-reflective layer 210 and the second semi-transparent semi-reflective layer 215 and surrounding the second transparent material 220 in the plane 201. In some embodiments, the absorptive material 240 includes chromium, titanium, or silicon.

The optical element 200 forms a resonator for a single wavelength in which light is confined in the vertical direction (the direction of the axis 202) by the first semi-transparent semi-reflective layer 210 and the second semi-transparent semi-reflective layer 220 and is confined in the horizontal direction (the direction of the plane 201) by the higher refractive index of the first transparent material 230 as compared to the lower refractive index of the second transparent material 220. Thus, as noted above, the optical element 200 can function as an angle-insensitive spectral filter that transmits a single wavelength of light of an incident beam of light, independent of the incident angle with the axis 202 of the incident beam of light.

The single wavelength that the optical element 200 transmits along the axis 202 is a function of the properties of the various elements of the optical element. For example, the single wavelength can be a function of the thickness (along the axis 202) of the first transparent material 230, the width (in the plane 201) of the first transparent material 230, and/or the first refractive index. Thus, in various implementations, increasing the thickness of the first transparent material 230 increases the wavelength of the transmitted light. As another example, the single wavelength can be a function of the width (in the plane 201) of the second transparent material and/or the second refractive index. As another example, the single wavelength can be function of the thickness (along the axis 202) of the first semi-transparent semi-reflective layer 210 and/or the second semi-transparent semi-reflective layer 215.

In various implementations, the thickness of the first transparent material 230 (and, thus, distance between the first semi-transparent semi-reflective layer 210 and the second semi-transparent semi-reflective layer 215) is between approximately 100 nm and 1000 nm. Thus, in various implementations, the thickness of the optical element 200 is less than 5 microns and, in some embodiments, less than 150 nm. In various implementations, the width of the second transparent material 220 (from edge to edge, each edge touching the absorptive material 240) is between approximately 1 micron and 2 microns. In various implementations, the width of the first transparent material 230 is between approximately 30% to 60% of the width of the second transparent material 220. Thus, in various implementations, the width of the first transparent material 230 is between approximately 0.3 microns and 1.2 microns.

Figure 3:
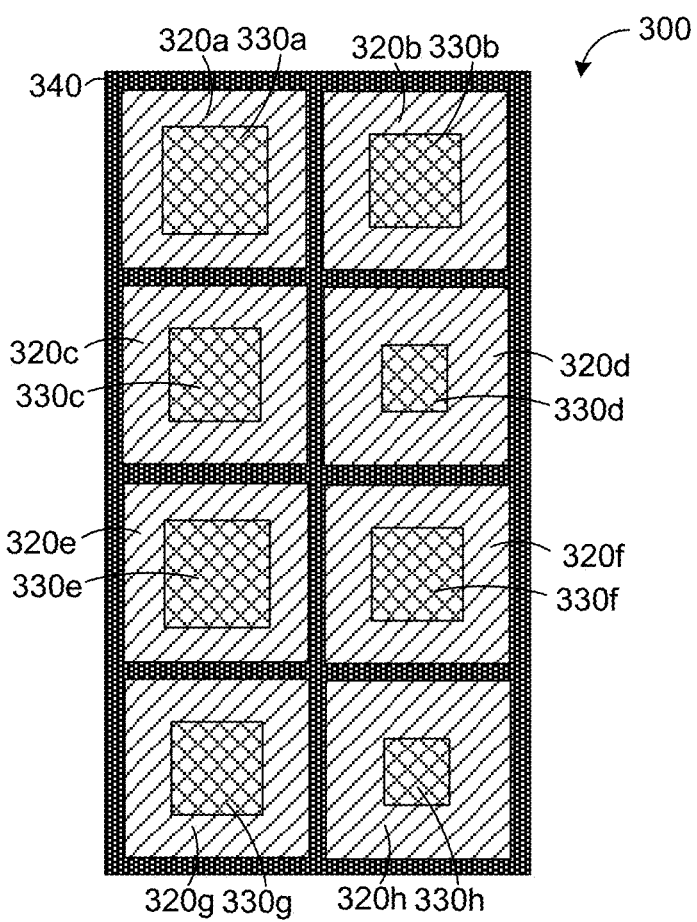
FIG. 3 illustrates a cross-sectional top view of an optical element array including a plurality of optical elements.

FIG. 3 illustrates a cross-sectional top view of an optical element array 300 including a plurality of optical elements. Each of the optical elements is substantially similar to the optical element 200 of FIG. 2A. Thus, each optical element of the optical element array 300 includes a first semi-transparent semi-reflective layer (not shown) and a second semi-transparent semi-reflective layer (not shown). Each optical element of the optical element array 300 includes a first transparent material 330a-330h (having a first refractive index) disposed between the first semi-transparent semi-reflective layer and the second semi-transparent semi-reflective layer. Each optical element of the optical element array 300 includes a second transparent material 320a-320h (having a second refractive index) disposed between the first semi-transparent semi-reflective layer and the second semi-transparent semi-reflective layer and surrounding the first transparent material 330a-330h in a plane parallel to the first semi-transparent semi-reflective layer and the second semi-transparent semi-reflective layer (e.g., parallel to the page in FIG. 3). The optical element array 300 includes an absorptive material 340 forming a grid, each cell of the grid including one of the optical elements of the optical element array 300.

Although FIG. 3 illustrates that the optical element array 300 including eight optical elements tiled in a grid pattern, it is to be appreciated that the optical element array 300 can include any number of optical elements, up to thousands or millions of optical elements. Further, in various implementations, the optical elements can be tiled in various ways, such as an offset grid or random tiling, or a line array for performing a spectral line scan.

In some embodiments, each of the optical elements of the optical element array 300 are identical. Thus, each optical element of the optical element array transmits the same single wavelength of light at a zero transmitted angle. In such embodiments, the optical element array can be made much larger than a single optical element (e.g., 10 centimeters by 10 centimeters) and provide the functionality of an angle-insensitive spectral filter.

In some embodiments, various optical elements of the optical element array 300 can have different properties (e.g., different sizes of the first transparent materials 330a-330h) and different optical elements can transmit different wavelengths of light, although a subset of the optical elements may be identical. In some embodiments, each of the different optical elements has the same thickness but different optical elements different in some other respect (e.g., the widths of the first transparent materials 330a-330h). Thus, the first semi-transparent semi-reflective layer of each of the plurality of optical elements lie in a first plane and the second semi-transparent semi-reflective layer of each of the plurality of optical elements lie in a second plane.

Figure 4:
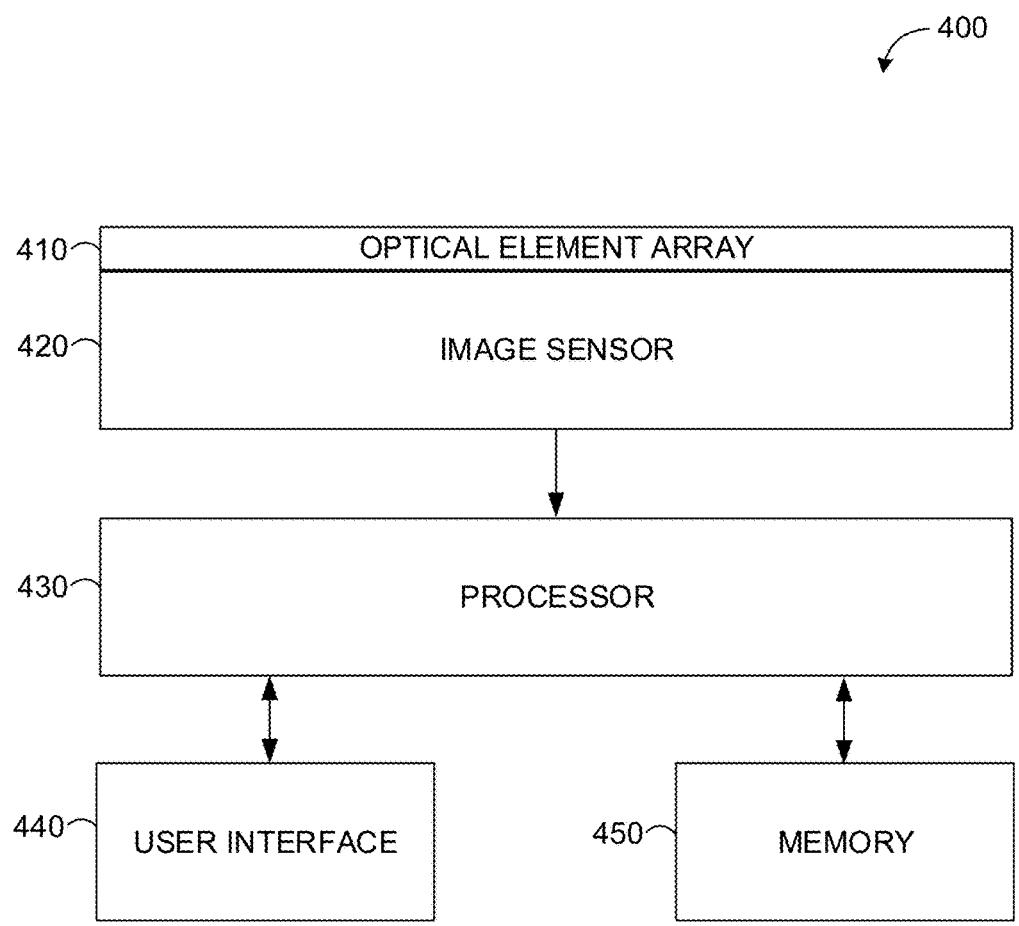
FIG. 4 illustrates a functional block diagram of an imaging system.

FIG. 4 illustrates a functional block diagram of an imaging system 400. The imaging system 400 includes an optical element array 410 including a plurality of optical elements. In some embodiments, the optical element array 410 is substantially similar to the optical element array 300 of FIG. 3. The imaging system 400 includes an image sensor 420 disposed to receive light transmitted through the optical element array. The image sensor 420 includes a plurality of sensor elements respectively corresponding to the plurality of optical elements. In various implementations, the image sensor 420 can include a CMOS (complementary metal-oxide-semiconductor) image sensor or a CCD (charge-coupled devices) image sensor.

In some embodiments, the plurality of optical elements of the optical element array 410 includes first plurality of optical elements configured to transmit a first wavelength of light (e.g., red light) to each of first plurality of sensor elements of the image sensor 420, a second plurality of optical elements configured to transmit a second wavelength of light (e.g., green light) to each of a second plurality of sensor elements of the image sensor 420, and a third plurality of optical elements configured to transmit a third wavelength of light (e.g., blue light) to each of a third plurality of sensor elements of the image sensor 420. For example, the optical element array 410 can be configured as a Bayer filter and the image sensor 420 can be configured as a Bayer filter sensor. Thus, the imaging system 400 can be used as a color camera.

In some embodiments, the plurality of optical elements of the optical element array 410 includes, for each of large number of wavelengths of light, at least one optical element configured to transmit the wavelength of light. The large number may be, for example, at least ten, twenty, fifty, or hundred. In some embodiments, the plurality of optical elements of the optical element array 410 includes at least one optical element configured to transmit an infrared wavelength of light (e.g., between 700 nm and 1000 nm) and/or at least one optical element configured to transmit an ultraviolet wavelength of light (e.g., between 10 nm and 400 nm). Thus, the imaging system 400 can be used as a spectrometer or, with sufficient redundancy in the array, as a multispectral imager or hyperspectral imager.

The imaging system 400 includes a processor 430 configured to receive data from the image sensor and generate a digital image. The digital image can be, in various implementations, a color image, a spectrum, a multispectral image, or a hyperspectral image. The imaging system 400 includes a user interface 440 that can be used to, among other things, display the digital image and a memory 450 that can be used to, among other things, store the digital image.

Whereas, as described above, the various parameters (e.g., sizes and refractive indexes of components) of the optical elements of the optical element array 410 can be chosen to control a spectrum of transmitted light at various locations and, thus, implement an angle-insensitive spectral filter, in other embodiments, the various parameters of the optical elements of the optical element array 410 can be chosen to control the phase of transmitted light at various locations. Thus, the optical element array 410 can implement a lens (e.g., a flat lens) or other multi-wavelength achromatic diffractive optical element.

Figure 5:
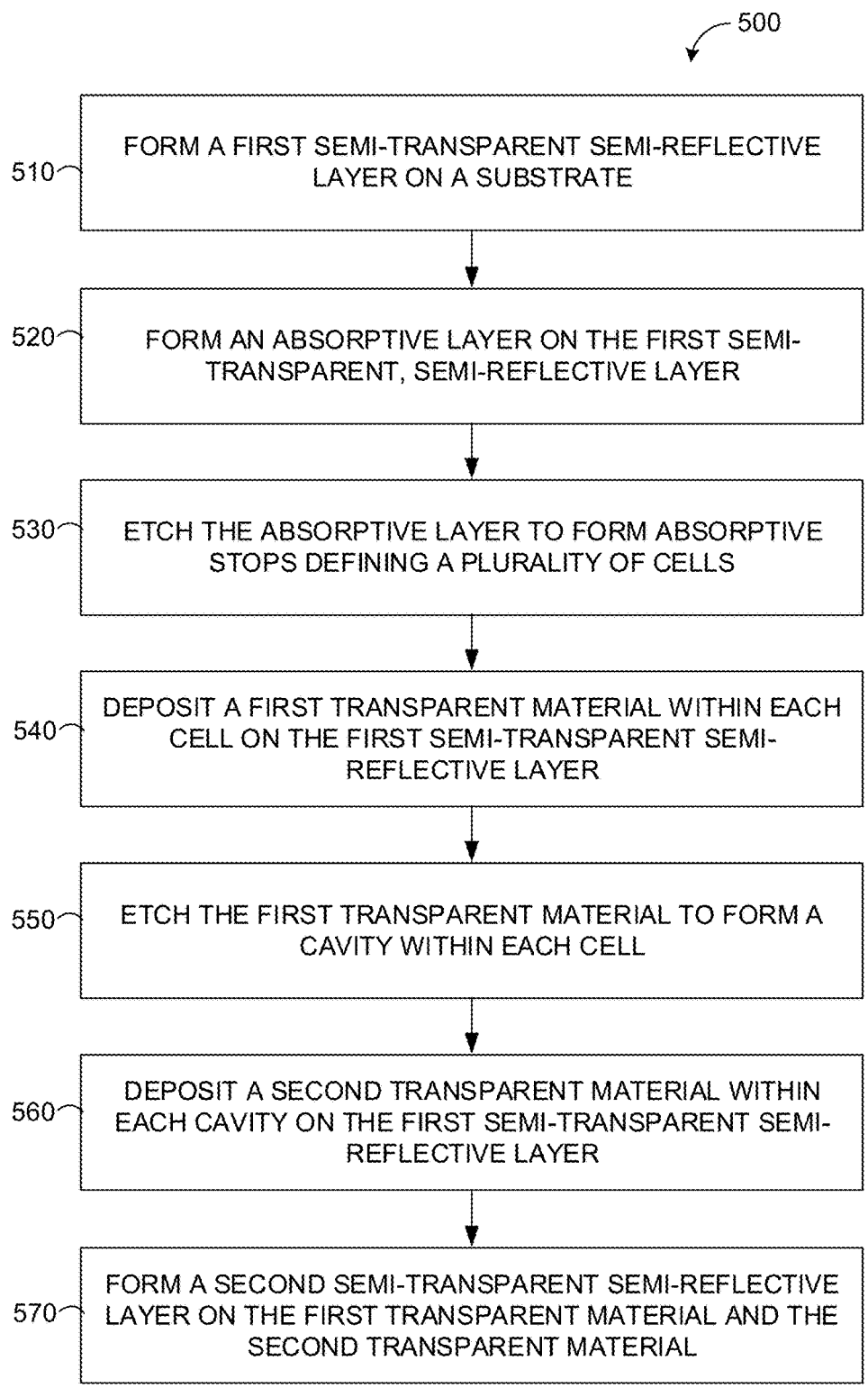
FIG. 5 illustrates a flowchart of a method of manufacturing an optical element.

FIG. 5 illustrates a flowchart of a method 500 of manufacturing an optical element. The method 500 can be employed to manufacture the optical element 200 of FIG. 2A, the optical element array 300 of FIG. 3, and/or any of the optical elements described further below. Although FIG. 500 describes a particular method of fabricating an optical element, it is to be appreciated that the optical elements described herein can be fabricated using other methods. Such other methods can include steps described below and/or other steps.

Figure 6A:
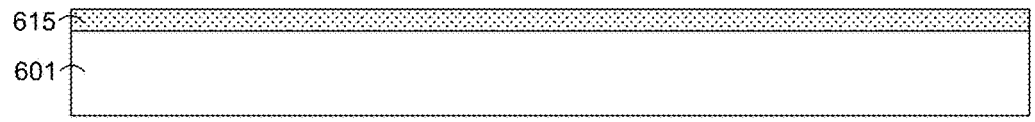
FIGS. 6A-6G illustrate an optical device in various stages of manufacture.

The method 500 begins, at block 510, with the formation of a first semi-transparent semi-reflective layer on a substrate. FIG. 6A illustrates a first semi-transparent semi-reflective layer 615 formed on a substrate 601. In various implementations, the substrate 601 is transparent, e.g., made of glass or plastic. In some embodiments, the first semi-transparent semi-reflective layer 615 is a thin (e.g., approximately 30 nm to 60 nm) layer of metal (e.g., silver or aluminum). Thus, in some embodiments, forming the first semi-transparent semi-reflective layer (in block 510) includes sputtering metal onto the substrate. In some embodiments, the first transparent semi-reflective layer 615 is a dielectric stack. Thus, in some embodiments, forming the first semi-transparent semi-reflective layer (in block 510) includes forming multiple sub-layers of different materials having different refractive indexes.

Figure 6B:
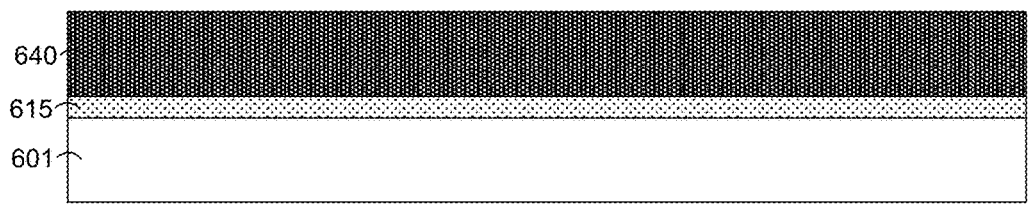

The method 500 continues, at block 520, with the formation of an absorptive layer on the first semi-transparent semi-reflective layer. FIG. 6B illustrates an absorptive layer 640 formed on the first semi-transparent semi-reflective layer 615. In various implementations, the absorptive layer is opaque, e.g., made of chromium, titanium, or silicon.

Figure 6C:
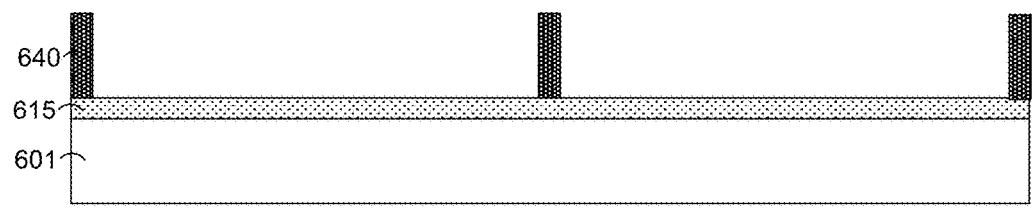

The method 500 continues, at block 530, with the etching of the absorptive layer to form absorptive stops defining a plurality of cells. FIG. 6C illustrates the absorptive layer 640 etched to form absorptive stops defining a plurality of cells. In some embodiments, etching the absorptive layer (in block 530) can include depositing a mask layer (or resist layer) in an appropriate pattern, applying an etchant, and removing the mask layer. For example, etching the absorptive layer (in block 530) can include depositing a mask layer using lithography, evaporating a portion of the absorptive layer 640, and lifting off the mask layer.

Figure 6D:
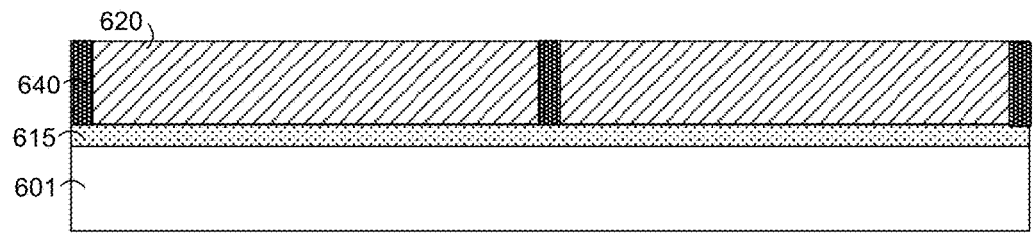

The method 500 continues, at block 540, with the deposition of a first transparent material within each cell on the first semi-transparent semi-reflective layer. FIG. 6D illustrates the first transparent material 620 deposited within each cell (e.g., between the absorptive stops formed from the absorptive layer 640) on the first semi-transparent semi-reflective layer 615. In some embodiments, the first transparent material 620 includes silicon dioxide. In some embodiments, the first transparent material 620 includes a dielectric stack. Thus, in some embodiments, depositing the first transparent material 620 includes depositing multiple layers of different materials having different refractive indexes.

Figure 6E:
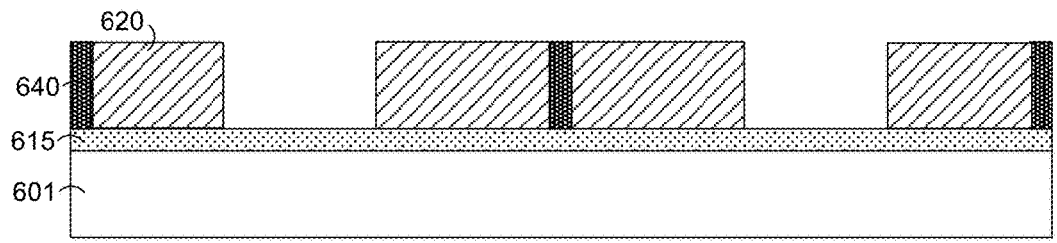

The method 500 continues, at block 550, with the etching of the first transparent material to form a cavity within each cell. FIG. 6E illustrates the first transparent material 620 etched to form a cavity within each cell. In some embodiments, etching the first transparent material (in block 550) can include depositing a mask layer (or resist layer) in an appropriate pattern (e.g., including a hole over the cavity to be formed), applying an etchant, and removing the mask layer. For example, etching the first transparent material layer (in block 550) can include depositing a mask layer using lithography, evaporating a portion of the first transparent material 620, and lifting off the mask layer.

Figure 6F:
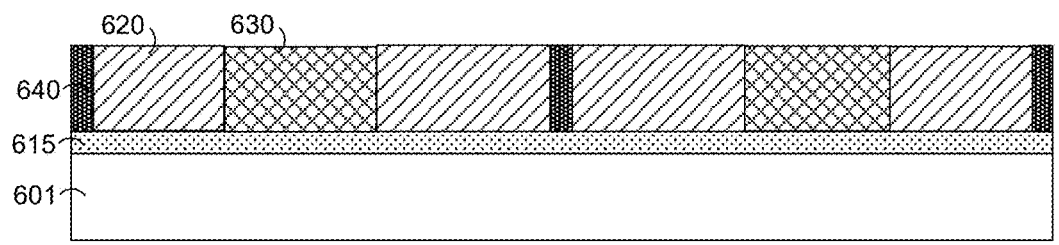

The method 500 continues, at block 560, with the deposition of a second transparent material within each cavity on the first semi-transparent semi-reflective layer. FIG. 6F illustrates a second transparent material 630 deposited within each cavity on the first semi-transparent semi-reflective layer 615. In some embodiments, the second transparent material 630 includes a polymer. Thus, in some embodiments, depositing the second transparent material (in block 560) includes spin coating a polymer into each cavity.

Figure 6G:
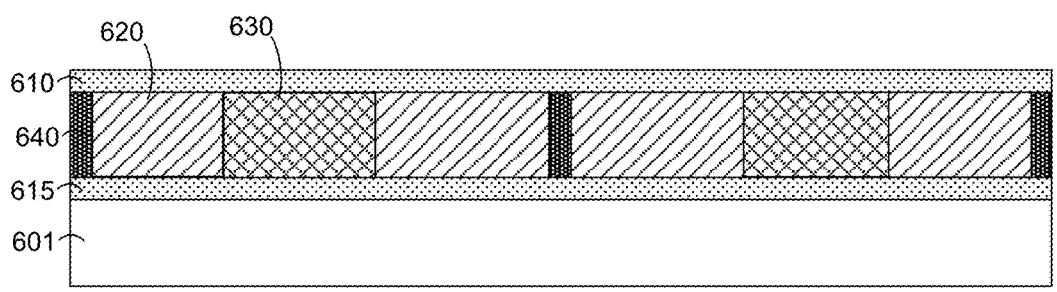

The method 500 continues, at block 570, with the formation of a second semi-transparent semi-reflective layer on the first transparent material and the second transparent material. FIG. 6G illustrates a second semi-transparent semi-reflective layer 610 formed on the first transparent material 620 and the second transparent material 630. In some embodiments, the second semi-transparent semi-reflective layer 610 is a thin (e.g., approximately 30 nm to 60 nm) layer of metal (e.g., silver or aluminum). Thus, in some embodiments, forming the second semi-transparent semi-reflective layer (in block 570) includes sputtering metal onto the substrate. In some embodiments, the second transparent semi-reflective layer 610 is a dielectric stack. Thus, in some embodiments, forming the first semi-transparent semi-reflective layer (in block 570) includes forming multiple sub-layers of different materials having different refractive indexes.

Figure 7:
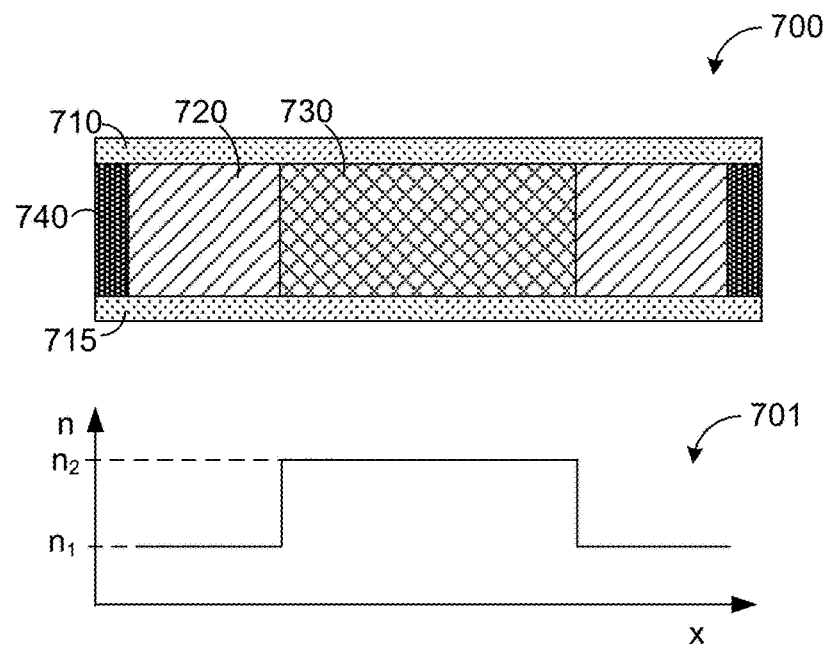
FIGS. 7-10 illustrate cross-sectional side views of various embodiments of an optical element and corresponding plots of refractive index as a function of distance along a width of the optical element.

FIG. 7 illustrates a cross-sectional side view of a first embodiment of an optical element 700 and a corresponding plot 701 of refractive index as a function of distance along a width of the optical element 700. The optical element 700 is substantially similar to the optical element 200 of FIG. 2A. In particular, the optical element 700 includes a first semi-transparent semi-reflective layer 710 and a second semi-transparent semi-reflective layer 715. The optical element 700 includes a first transparent material 730 sandwiched between the first semi-transparent semi-reflective layer 710 and the second semi-transparent semi-reflective layer 715 and a second transparent material 720 surrounding the first transparent material 730. The optical element 700 includes an absorptive material 740 surrounding the second transparent material 720.

Along the width of the optical element 700, between the absorptive material 740 on either side of the center of the optical element 700, the refractive index begins at a first value ($n_1$), the refractive index of the second transparent material 720. The refractive index increases to a second value ($n_2$), the refractive index of the first transparent material 730, at the boundary between the second transparent material 720 and the first transparent material 730. Finally, the refractive index decreases to the first value ($n_1$), the refractive index of the second transparent material 720, at the boundary between the first transparent material 730 and the second transparent material 720.

In various implementations, the first value ($n_1$) is approximately 1.5 and the second value ($n_2$) is approximately 1.7 (or greater). For example, the first transparent material 730 can include a polymer and the second transparent material 720 can include silicon dioxide.

Figure 8:
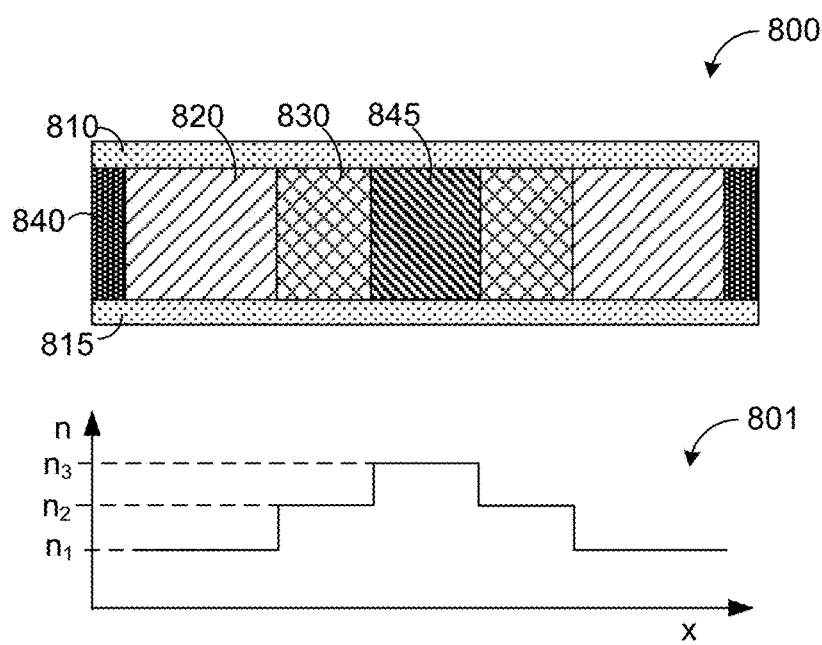

FIG. 8 illustrates a cross-sectional side view of a second embodiment of an optical element 800 and a corresponding plot 801 of refractive index as a function of distance along a width of the optical element 800. The optical element 800 differs from the optical element 700 of FIG. 7 in that the optical element 800 of FIG. 8 includes three different transparent materials with three different refractive indexes between the two semi-transparent mirrors.

In particular, the optical element 800 includes a first semi-transparent semi-reflective layer 810 and a second semi-transparent semi-reflective layer 815. The optical element 800 includes a first transparent material 845 sandwiched between the first semi-transparent semi-reflective layer 810 and the second semi-transparent semi-reflective layer 815, a second transparent material 830 surrounding the first transparent material 845, and a third transparent material 820 surrounding the second transparent material 830. The optical element 800 includes an absorptive material 840 surrounding the third transparent material 820.

Along the width of the optical element 800, between the absorptive material 840 on either side of the center of the optical element 800, the refractive index begins at a first value ($n_1$), the refractive index of the third transparent material 820. The refractive index increases to a second value ($n_2$), the refractive index of the second transparent material 830, at the boundary between the third transparent material 820 and the second transparent material 830. The refractive index increases again to a third value ($n_3$), the refractive index of the first transparent material 845, at the boundary between the second transparent material 830 and the first transparent material 845. The refractive index decreases to the second value ($n_2$), the refractive index of the second transparent material 830, at the boundary between the first transparent material 845 and the second transparent material 830 and decreases again to the first value ($n_1$), the refractive index of the third transparent material 820, at the boundary between the second transparent material 830 and the first transparent material 820.

In various implementations, the first value ($n_1$) is approximately 1.5, the third value ($n_3$) is approximately 1.7 (or greater), and the second value ($n_2$) lies between the first value and the second value (e.g., approximately 1.6). For example, the first transparent material 845 can include a polymer, the third transparent material 820 can include silicon dioxide, and the second transparent material 830 can include a different polymer or glass (doped with lead).

Figure 9:
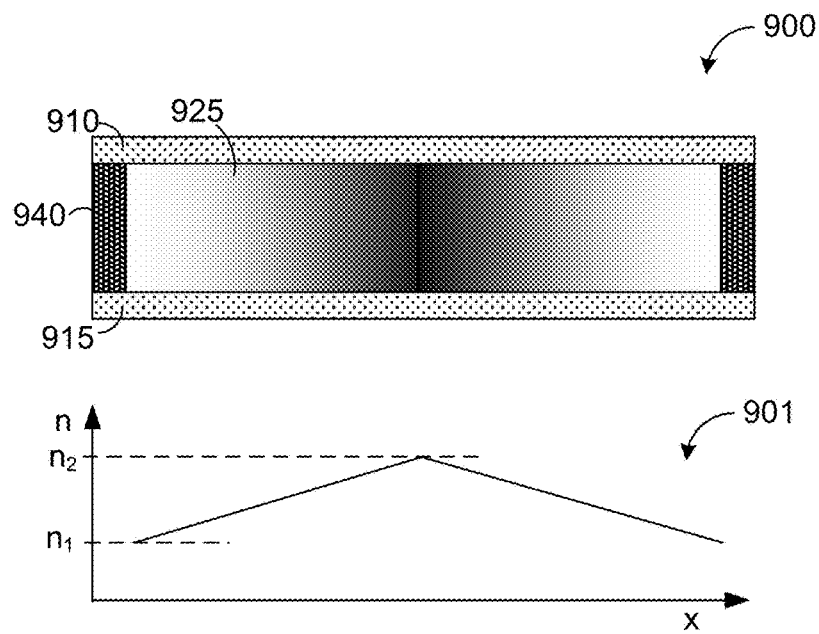

FIG. 9 illustrates a cross-sectional side view of a third embodiment of an optical element 900 and a corresponding plot 901 of refractive index as a function of distance along a width of the optical element 900. The optical element 900 differs from the optical element 700 of FIG. 7 in that the optical element 900 of FIG. 9 includes a single transparent material (with a varying refractive index) between the two semi-transparent mirrors.

In particular, the optical element 900 includes a first semi-transparent semi-reflective layer 910 and a second semi-transparent semi-reflective layer 915. The optical element 900 includes a transparent material 925 sandwiched between the first semi-transparent semi-reflective layer 910 and the second semi-transparent semi-reflective layer 915. The optical element 900 includes an absorptive material 940 surrounding the transparent material 925. The refractive index of the transparent material 925 varies as a function of distance along the width of the optical element 900.

Along the width of the optical element 900, between the absorptive material 940 on either side of the center of the optical element 900, the refractive index begins at a first value ($n_1$) and gradually increases to a second value ($n_2$) at approximately the center of the optical element 900. Then, the refractive index gradually decreases back to the first value ($n_1$). In various implementations, the first value ($n_1$) is approximately 1.5 and the second value ($n_2$) is approximately 1.7 (or greater). The transparent material 925 can include a polymer or glass with levels of a dopant or other impurity that vary along the width of the optical element 900.

Figure 10:
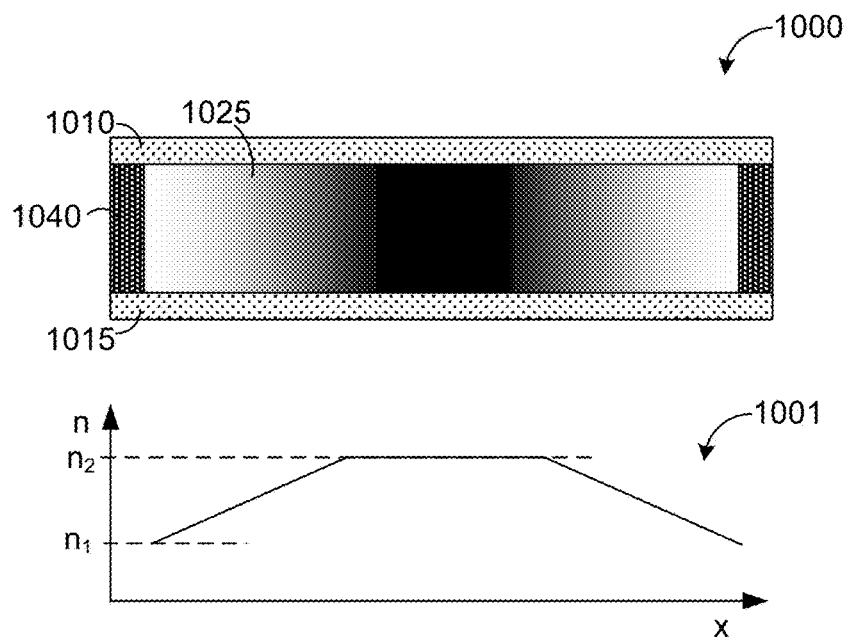

FIG. 10 illustrates a cross-sectional side view of a fourth embodiment of an optical element 1000 and a corresponding plot 1001 of refractive index as a function of distance along a width of the optical element 1000. The optical element 1000 differs from the optical element 900 of FIG. 9 in that the optical element 1000 of FIG. 10 includes a constant refractive index portion of the transparent material between the two semi-transparent mirrors.

In particular, the optical element 1000 includes a first semi-transparent semi-reflective layer 1010 and a second semi-transparent semi-reflective layer 1015. The optical element 1000 includes a transparent material 1025 sandwiched between the first semi-transparent semi-reflective layer 1010 and the second semi-transparent semi-reflective layer 1015. The optical element 1000 includes an absorptive material 1040 surrounding the transparent material 1025. The refractive index of the transparent material 1025 varies as a function of distance along the width of the optical element 1000, but includes a portion for which the refractive index is constant.

Along the width of the optical element 1000, between the absorptive material 1040 on either side of the center of the optical element 1000, the refractive index begins at a first value ($n_1$) and gradually increases to a second value ($n_2$). The refractive index remains constant at the second value ($n_2$) before gradually decreasing back to the first value ($n_1$). In various implementations, the first value ($n_1$) is approximately 1.5 and the second value ($n_2$) is approximately 1.7 (or greater). The transparent material 1025 can include a polymer or glass with levels of a dopant or other impurity that vary along the width of the optical element 1000.

Although FIGS. 9 and 10 illustrate a linear variation in refractive index (e.g., a triangle and a trapezoid), other embodiments have non-linear variation in refractive index. For example, the plot of refractive index can be Gaussian or may decay exponentially from the center.

Figure 11:
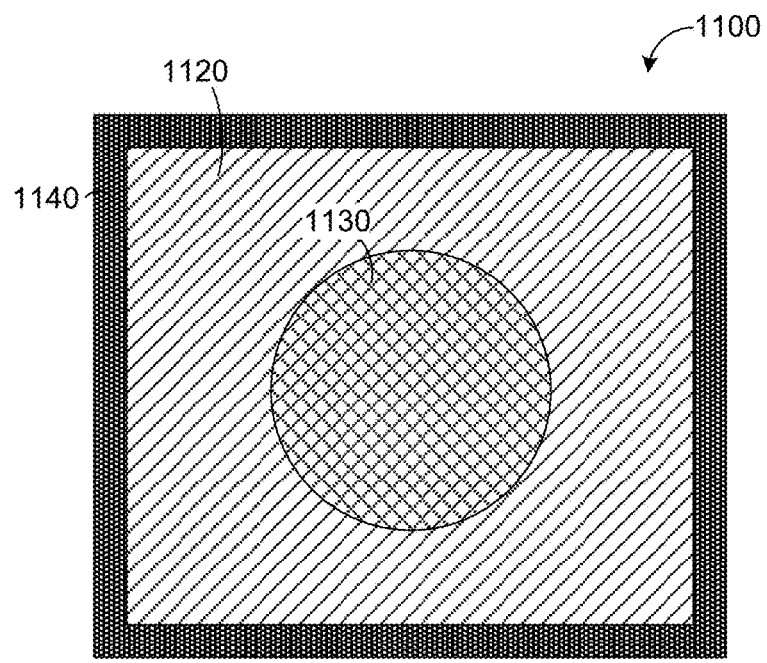
FIG. 11 illustrates a cross-sectional top view of an optical element with a circular transparent material.

FIG. 11 illustrates a cross-sectional top view of an optical element 1100 with a circular transparent material 1130. The optical element 1100 differs from the optical element 200 of FIG. 2B in that the first transparent material 1130 in FIG. 11 is in the shape of circle rather than the shape of a square.

Figure 12:
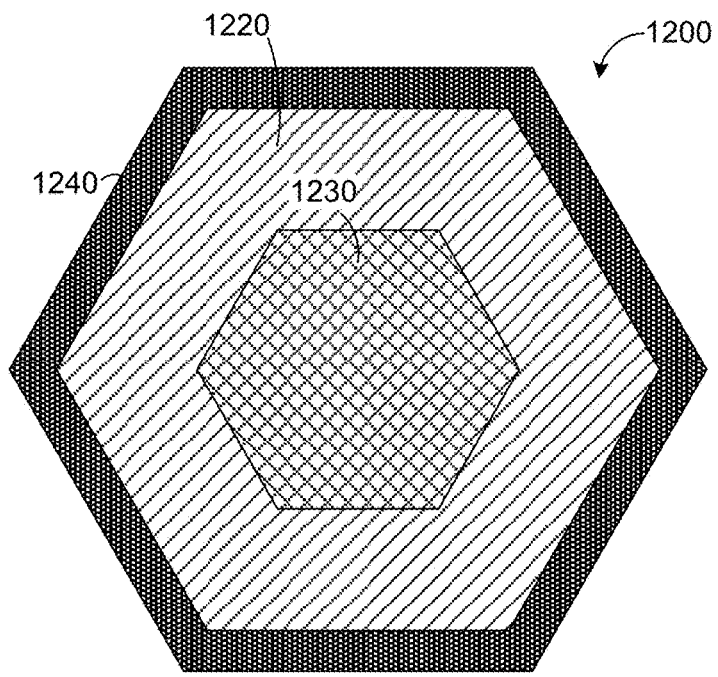
FIG. 12 illustrates a cross-sectional top view of a hexagonal optical element.

FIG. 12 illustrates a cross-sectional top view of an optical element 1100 with a hexagonal transparent material 1130. The optical element 1200 differs from the optical element 200 of FIG. 2B in that the first transparent material 1130 in FIG. 11 is in the shape of hexagon rather than the shape of a square. Further, the shape of the second transparent material 1220 and the shape of the optical element 1200 itself is in the shape of a hexagon rather than the shape of a square.

Although FIGS. 11 and 12 illustrate particular shapes, the first transparent material, second transparent material, and optical element can be any shape, including the shape of a triangle, rectangle, or octagon.

Figure 13:
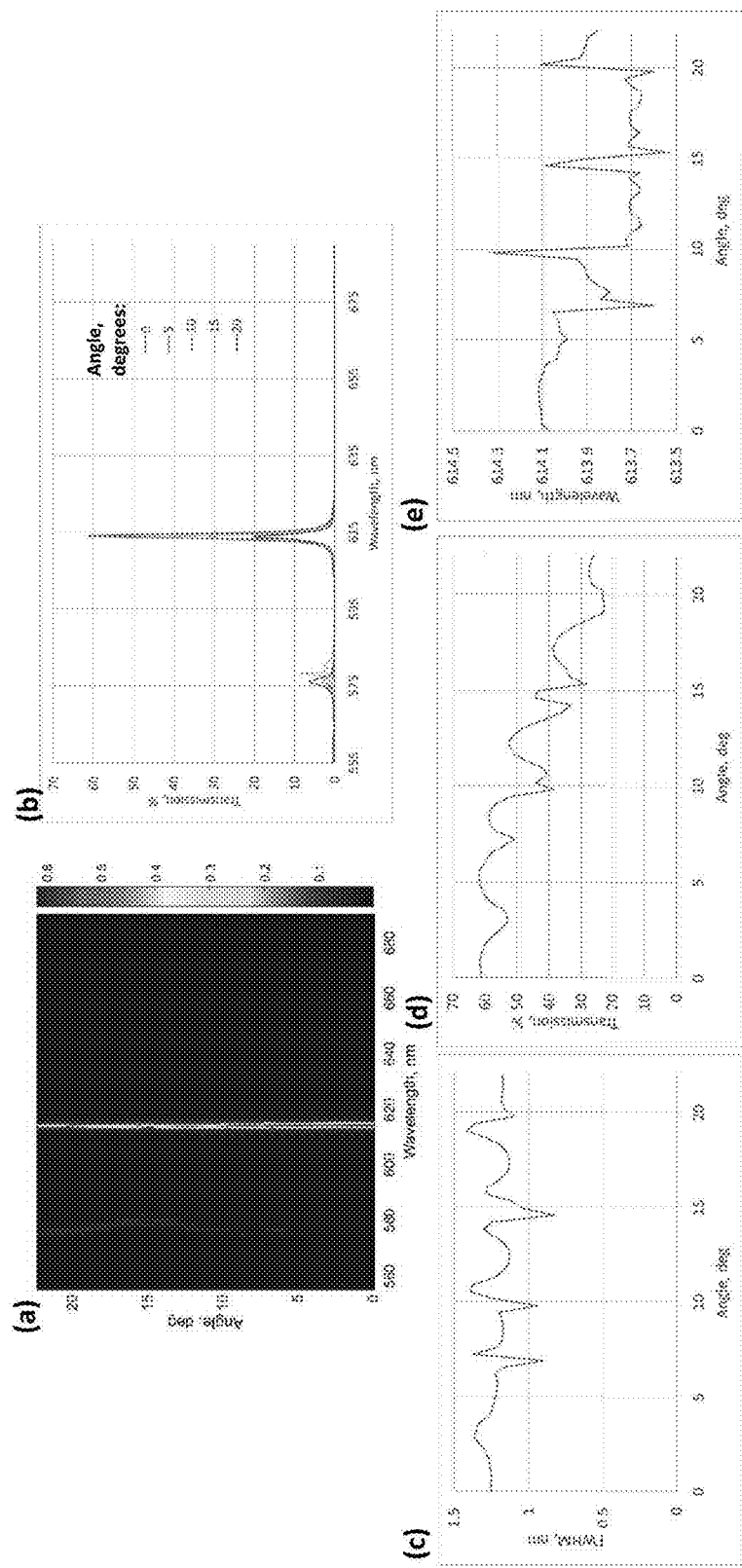
FIG. 13 illustrates a number of simulation results of an optical element of the type illustrated in FIG. 2A.

FIG. 13 illustrates a number of simulation results of an optical element 200 of the type illustrated in FIG. 2A. Plot (a) illustrates the transmission ratio as a function of wavelength and incident angle. Plot (b) illustrates the transmission percentage as a function of wavelength for a number of incident angles (e.g., horizontal lines through plot (a)). Plot (c) illustrates the full-width at half-maximum (FWHM) of the transmitted light as a function of incident angle. Plot (d) illustrates the transmission percentage as a function of incident angle for a single wavelength (e.g., a vertical line through plot (a)). Plot (e) illustrates the strongest transmitted wavelength as a function of incident angle.

As used herein, the terms "first", "second", "third", etc. should not be taken to imply an order, but are simply reference terms used to distinguish between similar elements. Further, the terms "first", "second", "third", etc. are not fixed, such that similar elements may be referred to as a "first" element in one embodiment and a "second" element in another embodiment.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs or GPGPUs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An optical element comprising:
   a first semi-transparent semi-reflective layer;
   a second semi-transparent semi-reflective layer;
   a first transparent material having a first refractive index and disposed between the first semi-transparent semi-reflective layer and the second semi-transparent semi-reflective layer; and
   a second transparent material having a second refractive index, disposed between the first semi-transparent semi-reflective layer and the second semi-transparent semi-reflective layer, and surrounding the first transparent material in a plane parallel to the first semi-transparent semi-reflective layer and the second semi-transparent semi-reflective layer, wherein the first refractive index is higher than the second refractive index.

2. The optical element of claim 1, wherein the optical element functions as an angle-insensitive spectral filter that transmits a single wavelength of light of an incident beam of light, independent of an incident angle of the incident beam of light with an axis perpendicular to the plane.

3. The optical element of claim 1, wherein the first semi-transparent semi-reflective layer comprises at least one of a metal layer between 30 and 60 nm thick or a dielectric stack.

4. The optical element of claim 1, wherein the first transparent material comprises a polymer and the first refractive index is greater than 1.7.

5. The optical element of claim 1, wherein the second transparent material comprises at least one of silicon dioxide or a dielectric stack.

6. The optical element of claim 1, further comprising an absorptive material disposed between the first semi-transparent semi-reflective layer and the second semi-transparent semi-reflective layer and surrounding the second transparent material in the plane.

7. The optical element of claim 1, wherein the absorptive material comprises at least one of chromium, titanium, or silicon.

8. The optical element of claim 1, wherein a width of the second transparent material is between approximately 1 and 2 microns and a width of the first transparent material is between approximately 30% and 60% of the width of the second transparent material.

9. The optical element of claim 1, wherein a distance between the first semi-transparent semi-reflective layer and the second semi-transparent semi-reflective layer is between approximately 100 and 1000 nm.

10. A method of manufacturing an optical element, the method comprising:
    forming a first semi-transparent semi-reflective layer on a substrate;
    depositing a first transparent material on the first semi-transparent semi-reflective layer;
    etching the first transparent material to form a cavity;
    depositing a second transparent material within the cavity on the semi-transparent semi-reflective layer, wherein the first transparent material has a first refractive index, the second transparent material has a second refractive index, and the second refractive index is greater than the first refractive index; and
    forming a second semi-transparent semi-reflective layer on the first transparent material and second transparent material.

11. The method of claim 10, wherein forming the first semi-transparent semi-reflective layer on the substrate includes forming a dielectric stack.

12. The method of claim 10, wherein etching the first transparent material comprising depositing a mask layer on the first transparent material, the mask layer including a hole over the cavity to be formed.

13. The method of claim 10, wherein depositing the second transparent material includes spin coating a polymer.

14. The method of claim 10, wherein the cavity has a width between approximately 0.3 and 1.2 microns.

15. The method of claim 10, wherein a distance between the first semi-transparent semi-reflective layer and the second semi-transparent semi-reflective layer is between approximately 100 and 1000 nm.

16. An imaging device comprising:
    an optical element array including a plurality of optical elements, each of the plurality of optical elements including a first semi-transparent semi-reflective layer, a second semi-transparent semi-reflective layer, a first transparent material having a first refractive index and disposed between the first semi-transparent semi-reflective layer and the second semi-transparent semi-reflective layer, and a second transparent material having a second refractive index, disposed between the first semi-transparent semi-reflective layer and the second semi-transparent semi-reflective layer, and surrounding the first transparent material in a plane parallel to the first semi-transparent semi-reflective layer and the second semi-transparent semi-reflective layer, wherein the first refractive index is higher than the second refractive index;
    an image sensor disposed to receive light transmitted through the optical element array, the image sensor including a plurality of sensor elements respectively corresponding to the plurality of optical elements; and
    a processor configured to receive data from the image sensor and generate a digital image.

17. The imaging device of claim 16, wherein the plurality of optical elements includes a first plurality of optical elements configured to transmit a first wavelength of light, a second plurality of optical elements configured to transmit a second wavelength of light, and a third plurality of optical elements configured to transmit a third wavelength of light.

18. The imaging device of claim 16, wherein the plurality of optical elements includes, for each of at least ten wavelengths of light, at least one optical element configured to transmit the wavelength of light.

19. The imaging device of claim 16, wherein the first semi-transparent semi-reflective layer of each of the plurality of optical elements lie in a first plane and the second semi-transparent semi-reflective layer of each of the plurality of optical elements lie in a second plane.

20. The imaging device of claim 16, wherein the optical element array forms at least one of a color filter or a lens.

* * * * *